(12) United States Patent
Sone

(10) Patent No.: US 8,472,110 B2
(45) Date of Patent: Jun. 25, 2013

(54) OPTICAL AMPLIFIER, CONTROL CIRCUIT, AND METHOD OF CONTROLLING OPTICAL AMPLIFIER

(75) Inventor: Kyosuke Sone, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 268 days.

(21) Appl. No.: 12/648,639

(22) Filed: Dec. 29, 2009

(65) Prior Publication Data

US 2010/0321768 A1    Dec. 23, 2010

(30) Foreign Application Priority Data

Jan. 9, 2009    (JP) .................................... 2009-3240

(51) Int. Cl.
H01S 5/00    (2006.01)

(52) U.S. Cl.
USPC ...................................... 359/344; 359/341.42

(58) Field of Classification Search
USPC ............................................. 359/341.42, 344
See application file for complete search history.

(56) References Cited

U.S. PATENT DOCUMENTS

| | | | | |
|---|---|---|---|---|
| 5,706,126 A * | 1/1998 | Fujita | ........................ | 359/341.42 |
| 6,023,366 A * | 2/2000 | Kinoshita | ................ | 359/337.12 |
| 6,198,571 B1 * | 3/2001 | Yang | .............................. | 359/337 |
| 6,259,553 B1 * | 7/2001 | Kinoshita | ..................... | 359/337 |
| 6,487,008 B2 * | 11/2002 | Morito | ........................... | 359/344 |
| 6,639,716 B1 | 10/2003 | Tomofuji | | |
| 7,274,010 B2 * | 9/2007 | Matsuda et al. | ......... | 250/214 LA |
| 7,362,498 B1 * | 4/2008 | Li et al. | ..................... | 359/341.41 |
| 7,405,870 B2 * | 7/2008 | Qiao et al. | ................ | 359/341.41 |
| 2004/0126107 A1 * | 7/2004 | Jay et al. | .......................... | 398/25 |
| 2004/0136055 A1 * | 7/2004 | Michie et al. | ............ | 359/337.11 |
| 2006/0024063 A1 * | 2/2006 | Onaka et al. | .................. | 398/149 |
| 2006/0077534 A1 | 4/2006 | Griggs et al. | | |
| 2007/0297044 A1 * | 12/2007 | Qiao et al. | ..................... | 359/337 |
| 2011/0116161 A1 * | 5/2011 | Yoshida et al. | ............... | 359/344 |

FOREIGN PATENT DOCUMENTS

| | | |
|---|---|---|
| JP | 6-260709 | 9/1994 |
| JP | 9-83054 | 3/1997 |
| JP | 2000-232433 | 8/2000 |
| JP | 2003-46186 | 2/2003 |
| JP | 2003-258386 | 9/2003 |
| JP | 2008-502162 | 1/2008 |
| JP | 2008-141673 | 6/2008 |

OTHER PUBLICATIONS

Office Action issued by the Japanese Patent Office on Jan. 22, 2013 in the corresponding Japanese patent application No. 2009-003240.

* cited by examiner

*Primary Examiner* — Eric Bolda
(74) *Attorney, Agent, or Firm* — Staas & Halsey LLP (57) ABSTRACT

An optical amplifier includes a semiconductor optical amplifier which has a gain that changes in accordance with a wavelength of input light and which generates a noise light power having different levels in accordance with a drive current, a detector that detects an optical power branched from output light of the semiconductor optical amplifier, and a controller that controls supply of the drive current based on the optical power such that an output light power of the semiconductor amplifier is a sum of a target signal light power and the noise light power.

12 Claims, 10 Drawing Sheets

| DRIVE CURRENT | ASE POWER |
|---|---|
| I1 | P1 |
| I2 | P2 |
| ⋮ | ⋮ |
| In | Pn |

FIG. 7

| DRIVE CURRENT | TARGET OUTPUT LIGHT POWER |
|---|---|
| I1 | S + P1 |
| I2 | S + P2 |
| ⋮ | ⋮ |
| In | S + Pn |

OPTICAL AMPLIFIER, CONTROL CIRCUIT, AND METHOD OF CONTROLLING OPTICAL AMPLIFIER

CROSS REFERENCE TO RELATED APPLICATION

This application is based upon and claims the benefit of priority of the prior Japanese Patent Application No. 2009-003240, filed on Jan. 9, 2009, the entire contents of which are incorporated herein by reference.

FIELD

The embodiments discussed herein are related to an optical amplifier performing given output level control of a semiconductor optical amplifier, a control circuit, and a method of controlling an optical amplifier.

BACKGROUND

In optical communications systems, to improve the minimum reception sensitivity of an optical receiver, a method is used in which input signal light is amplified by, for example, providing an optical preamplifier in a stage prior to the optical receiver. In the optical preamplifier, generally, output level control (ALC: automatic level control) is used to increase the input dynamic range of the optical receiver system (for example, the whole optical receiver apparatus including the optical preamplifier and optical receiver), whereby an optical signal having a given optical power is output to the subsequent optical receiver.

Hitherto, an erbium doped fiber amplifier (EDFA) has been generally used as the optical amplifier used in such an optical receiver system. However, since an EDFA has restrictions on the folding radius, reduction in size is difficult.

Hence, semiconductor optical amplifiers (SOAs) have been recently the focus of considerable attention. SOAs may be manufactured using equipment and a process similar to those for semiconductor laser devices, and have been developed as amplifiers which realize reduction in size, lower power consumption, and lower cost. SOAs are also expected to allow reduction in the size of a system by use of monolithic integration with other semiconductor devices or hybrid integration with other optical parts.

The ALC in an SOA is realized by monitoring the output light power of the SOA and performing feedback control of the drive current of the SOA. More specifically, in the ALC of an SOA, the signal light power included in the output light of the SOA is controlled to be at a given level by performing feedback control of the drive current so as to make the output light power of the SOA be at a given level. Thereby, signal light having a given level of an optical power is output to the subsequent optical receiver.

Note that in a feedback configuration using detection of an average, a signal light intensity controller has been conventionally proposed which may reduce a decrease in output signal intensity by detecting an output signal including amplified spontaneous emission (ASE), and thereby controlling the injected current. See, for example, Japanese Laid-open Patent Publication No. 2003-46186.

However, when input light power input to an SOA becomes small, the ratio of ASE power to signal light power in the output light of the SOA increases and a difference between output light power and signal light power is generated. Hence, even if the output light power is controlled to be at a given level, the signal light power is not controlled to be at a given level.

In addition, when the wavelength of signal light input to the SOA changes, the proportion of ASE power in the output light power of the SOA changes accordingly, and hence, the control for keeping the output light power at a given level has wavelength dependency.

Figure 13:
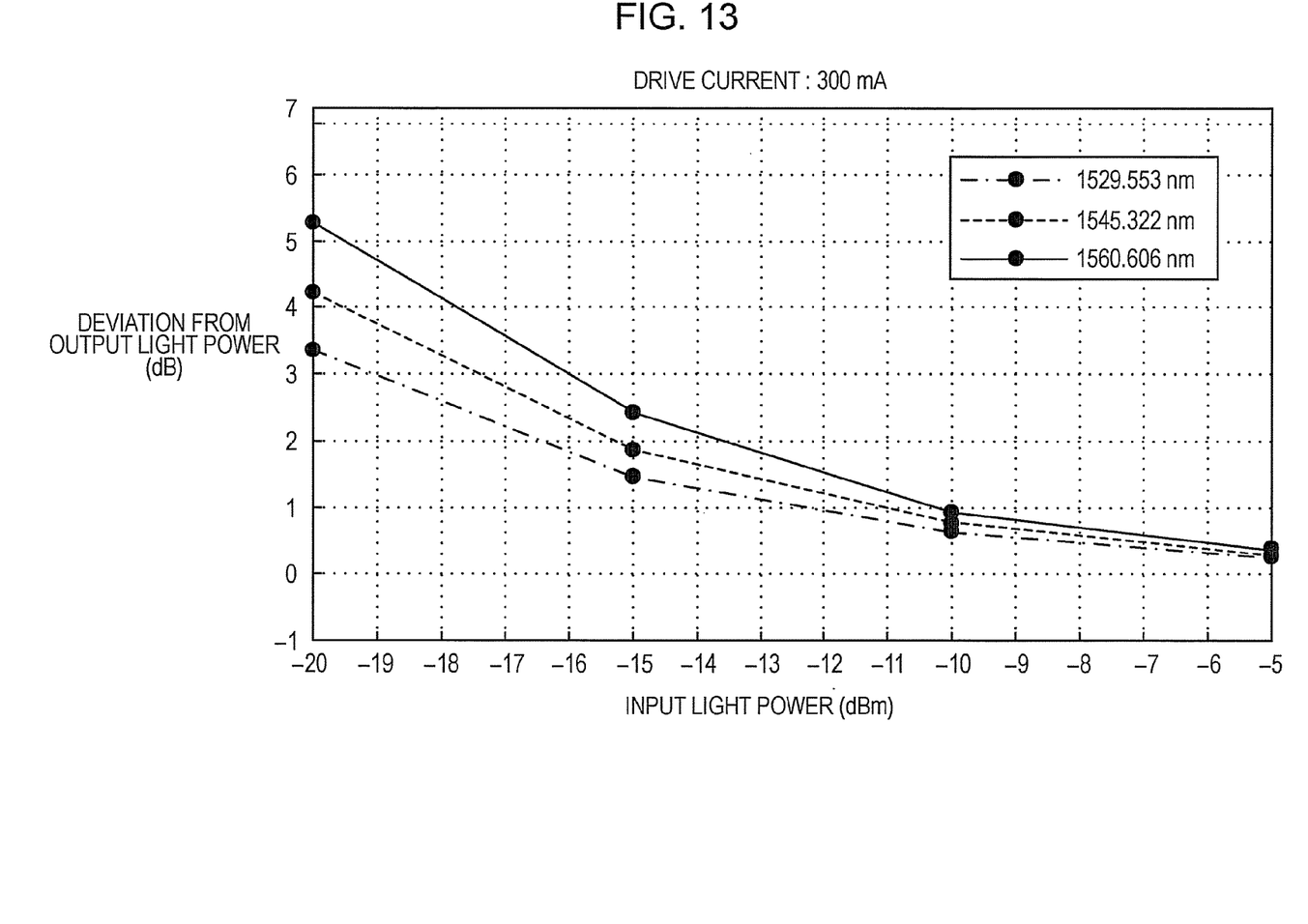
FIG. 13 illustrates the difference between output light power and signal light power versus the input light power of an SOA.

FIG. 13 illustrates the difference between the output light power and signal light power versus the input light power of an SOA. The horizontal axis of FIG. 13 represents the input power of signal light input to the SOA, and the vertical axis represents the difference between the output light power and the signal light power of the signal light included in the output light of the SOA. In FIG. 13, the difference between the output light power and signal light power versus the input light power of the SOA is illustrated for three different wavelengths.

Referring to FIG. 13, the smaller the input light power, the larger the difference between the output light power and signal light power of the SOA. This is because, the smaller the input light power, the larger the ratio of ASE power to signal light power of the SOA output light. Hence, even when the ALC of the SOA performs control such that the output light power of the SOA is at a given level, the signal light power is not controlled to be at a given level.

Referring again to FIG. 13, the difference between the output light power and the signal light power is larger for a long wavelength than for a short wavelength. This is because the amplification is lower for longer wavelengths, and if the amplification is increased, the ratio of ASE power to signal light power of the SOA output light increases. Consequently, wavelength dependency is generated in the control of keeping the output light level at a given level, in the ALC of the SOA.

SUMMARY

An optical amplifier includes a semiconductor optical amplifier which has again that changes in accordance with a wavelength of input light and which generates a noise light power having different levels in accordance with a drive current; a detector that detects an optical power branched from output light of the semiconductor optical amplifier; and a controller that controls supply of the drive current based on the optical power such that an output light power of the semiconductor optical amplifier is a sum of a target signal light power and the noise light power.

The object and advantages of the various embodiments will be realized and attained by means of the elements and combinations particularly pointed out in the claims.

It is to be understood that both the foregoing general description and the following detailed description are exemplary and explanatory and are not restrictive of the various embodiments, as claimed.

DESCRIPTION OF THE PREFERRED EMBODIMENTS

Figure 1:
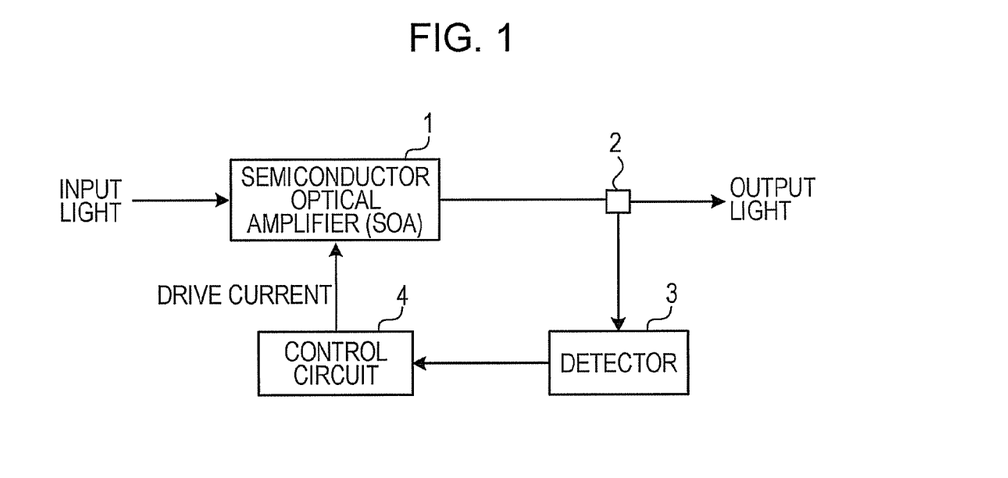
FIG. 1 illustrates an optical amplifier.

FIG. 1 illustrates an optical amplifier. Referring to FIG. 1, the optical amplifier includes a semiconductor optical amplifier (SOA) 1, an optical coupler 2, a detector 3, and a control circuit 4.

The SOA 1 generates noise light power in accordance with the wavelength of the input light. In addition, the SOA 1 generates noise light power in accordance with a drive current. The noise light power is, for example, ASE power.

The optical coupler 2 branches a portion of the output light of the SOA 1 and outputs it to the detector 3.

The detector 3 detects the optical power of the output light of the SOA 1 branched by the optical coupler 2.

The control circuit 4 outputs a drive current for the SOA 1 such that the output light power of the SOA 1 is the sum of target signal light power and noise light power based on the optical power detected by the detector 3.

For instance, the control circuit 4 outputs to the SOA 1 a drive current which will make the signal light input to the SOA 1 be output as target signal light power. At this time, the output light power of the SOA 1 includes noise light power that depends on the drive current. Hence, the control circuit 4 outputs a drive current which will make the output light power of the SOA 1 the sum of the target signal light power and the noise light power, so that the SOA 1 always outputs the target signal light power.

Since the amplification factor of the SOA 1 for obtaining the target signal light power changes in accordance with the wavelength of the input signal light, the drive current output to the SOA 1 is changed accordingly. For instance, the longer the wavelength of the input signal light, the larger the required drive current. However, the control circuit 4 outputs a drive current which will make the output light power the sum of the target signal light power and noise light power so that the target signal light power is always obtained from the SOA 1.

In this manner, the optical amplifier, based on the optical power of the detector 3, outputs a drive current such that the output light power of the SOA 1 is the sum of the target signal light power and the noise light power of the SOA 1. Thereby, the signal light power is controlled to be at a given level irrespective of the proportion of noise light power included in the output light power, and hence, the signal light power is controlled to be at a given level irrespective of the magnitude of the optical power of the input light and also irrespective of the wavelength of the input light.

A first embodiment will now be described in detail with reference to the drawings.

Figure 2:
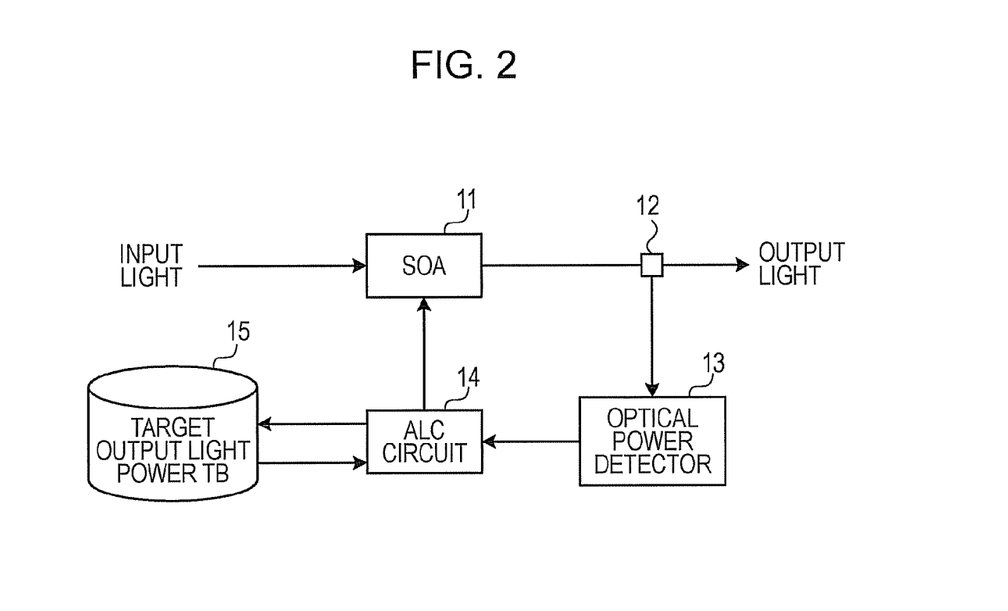
FIG. 2 is a block diagram illustrating an optical amplifier according to a first embodiment.

FIG. 2 illustrates an optical amplifier according to the first embodiment. Referring to FIG. 2, the optical amplifier includes an SOA 11, an optical coupler 12, an optical power detector 13, an ALC circuit 14, and a target output light power table (TB) 15. For example, an optical receiver terminating an optical signal is provided in a stage subsequent to the optical amplifier. The optical amplifier amplifies input light input from an optical network, and outputs output light to the optical receiver. At this time, the optical amplifier performs control such that signal light power included in the output light of the SOA 11 is at a given level.

The SOA 11 amplifies the input light input thereto. The SOA 11 amplifies the input light in accordance with a drive current output from the ALC circuit 14. The output light output from the SOA 11 includes ASE due to the SOA 11 in addition to the signal light. When the output light power is at a given level, the SOA 11 generates a different ASE amount in accordance with the wavelength of the input light and the drive current, because the gain is different in accordance with the wavelength of the input light.

The optical coupler 12 branches a portion of the output light output from the SOA 11, and outputs it to the optical power detector 13. The optical coupler 12 branches the output light at an intensity ratio of, for example, 9:1, and outputs 90% of the output light to the receiver in the subsequent stage and 10% of the output light to the optical power detector 13.

The optical power detector 13 detects the output light power of the output light branched by the optical coupler 12. The optical power detector 13 detects the output light power over the whole wavelength range of the output light.

The ALC circuit 14 controls the amplification factor of the SOA 11 by outputting a drive current to the SOA 11, thereby controlling the signal light power output from the SOA 11 so as to be at a given level. The ALC circuit 14 obtains target output light power corresponding to the currently output drive current from the target output light power TB 15, compares the obtained target output light power with output light power that is output from the optical power detector 13, and outputs a new drive current to the SOA 11 based on the comparison result.

For instance, when the output light power that is output from of the optical power detector 13 is larger than the target output light power obtained from the target output light power TB 15, the ALC circuit 14 decreases the drive current so as to decrease the output light power. When the output light power that is output from of the optical power detector 13 is smaller than the target output light power obtained from the target output light power TB 15, the ALC circuit 14 increases the drive current so as to increase the output light power. The ALC circuit 14 continues the above drive current control until there is no longer a difference between the target output light power and the output light power.

The target output light power TB 15 is, for example, a storage unit such as a memory. The target output light power TB 15 stores data regarding drive currents output to the SOA 11 and the associated target output light power of output light power to be output corresponding to the drive currents from the optical power detector 13. As will be described later, the target output light power is based on the sum of the target signal light power of the SOA 11 and ASE power. By this control, the signal light power of the output light of the SOA 11 is kept at a given level by the optical amplifier irrespective of the magnitude of the input light power or the wavelength of the input light.

Figure 3:
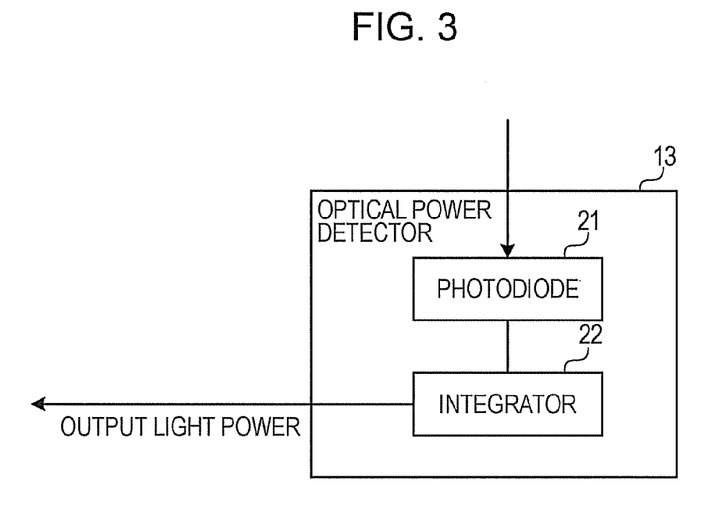
FIG. 3 illustrates the details of an optical power detector illustrated in FIG. 2.

FIG. 3 illustrates the details of the optical power detector 13 illustrated in FIG. 2. Referring to FIG. 3, the optical power detector 13 includes a photodiode 21 and an integrator 22.

The photodiode 21 detects the output light power of output light branched by the optical coupler 12. The photodiode 21 detects the output light power over the whole wavelength range of the output light.

The integrator 22 integrates the output light power output from the photodiode 21. In other words, the integrator 22 removes the high frequency components of the output light power output from the photodiode 21.

Figure 4:
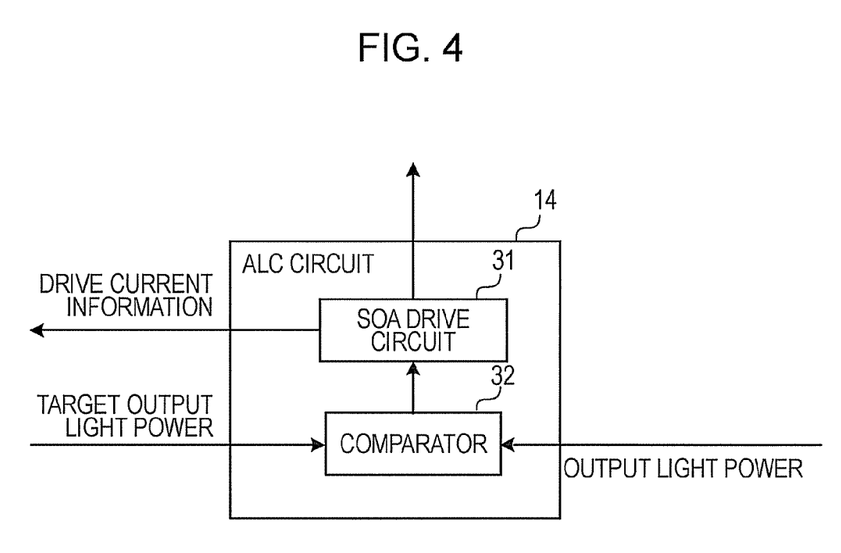
FIG. 4 illustrates the details of an ALC circuit illustrated in FIG. 2.

FIG. 4 illustrates the details of the ALC circuit 14 illustrated in FIG. 2. Referring to FIG. 4, the optical power detector 13 includes an SOA drive circuit 31 and a comparator 32.

The SOA drive circuit 31 outputs the value of a drive current (drive current information) currently output to the SOA 11 to the target output light power TB 15. The target output light power TB 15 outputs to the comparator 32 target output light power corresponding to the drive current information output from the SOA drive circuit 31.

The comparator 32 compares the target output light power output from the target output light power TB 15 and the output light output from the optical power detector 13. The comparator 32 outputs the result of the comparison between the target output light power and the output light power to the SOA drive circuit 31.

The SOA drive circuit 31 outputs a drive current to the SOA 11 based on the result of the comparison between the target output light power and the output light power performed by the comparator 32. For instance, when the output light power is larger than the target output light power, the SOA drive circuit 31 decreases the drive current so as to decrease the output light power output from the SOA 11. When the output light power is smaller than the target output light power, the SOA drive circuit 31 increases the drive current so as to increase the output light power.

The SOA drive circuit 31, while outputting the drive current based on the comparison result of the comparator 32 to the SOA 11, outputs the drive current information of the drive current to the target output light power TB 15. The target output light power TB 15 outputs to the comparator 32 target output light power corresponding to the drive current information output from the SOA drive circuit 31, and the comparator 32 compares the target output light power from the target output light power TB 15 with the output light power from the optical power detector 13. The SOA drive circuit 31 outputs a new drive current to the SOA 11 based on the comparison result of the comparator 32.

The SOA drive circuit 31 and the comparator 32 continue the above operation until there is no longer a difference between the target output light power and the output light power. By this operation, the signal light power of the SOA 11 is controlled to be at a given level.

Note that the SOA drive circuit 31 may determine that there is no difference between the target output light power and the output light power when the difference between the target output light power and the output light power falls within a predetermined range.

Figure 5:
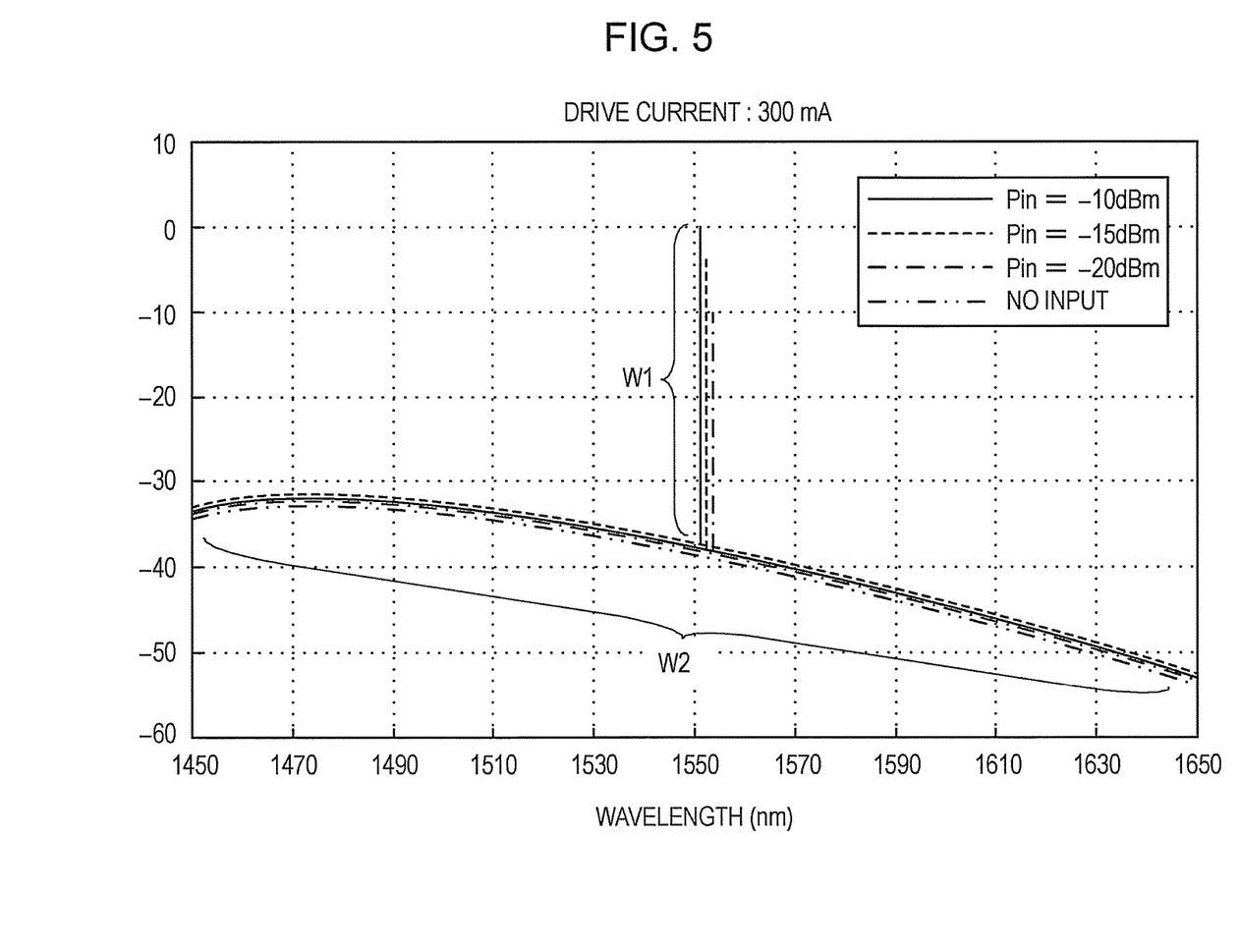
FIG. 5 illustrates SOA output light spectra for different levels of the signal light power of input light.

FIG. 5 illustrates the SOA 11 output light spectra for different levels of the signal light power of the input light. The horizontal axis represents wavelength and the vertical axis represents power. The SOA 11 output light spectra illustrated in FIG. 5 correspond to the case where the drive current of the SOA 11 is 300 mA.

FIG. 5 illustrates the SOA 11 output light spectra for three levels of the signal light power of the input light with the same wavelength. FIG. 5 also illustrates the SOA 11 output light spectrum when there is no input light. In FIG. 5, waveforms W1 represent the SOA 11 output light spectra corresponding to signal light and waveforms W2 represent the SOA 11 output light spectra corresponding to ASE.

The range used for the optical amplification of the SOA 11 is a linear range portion which does not cause signal deterioration. Hence, when the drive current is at a constant level, the magnitude of ASE power included in the output light of the SOA 11 is approximately at a constant level irrespective of the magnitude of the signal light power of the input light or the presence/non-presence of the input light.

For instance, when the drive current of the SOA 11 is at a constant level of 300 mA, as illustrated in FIG. 5, the ASE power (the area defined by wave W2) of the SOA 11 is approximately at a constant level even when the signal light power of the input light varies. The ASE power of the output light of the SOA 11 is approximately at a constant level even when input light is not input to the SOA 11. Also for the drive currents of other magnitudes, the ASE power of the output light of the SOA 11 is approximately at a constant level irrespective of the magnitude of the signal light power in the input light, when the drive current is at a constant level.

Figure 6:
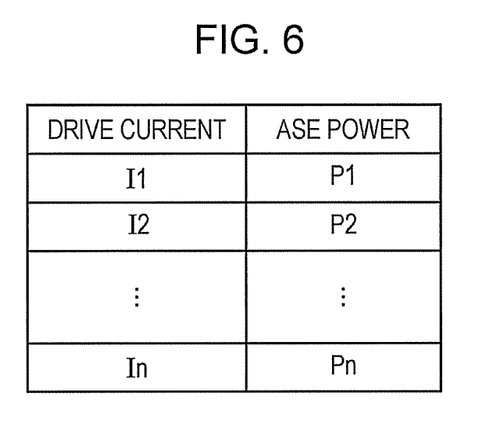
FIG. 6 illustrates ASE power versus drive current.

FIG. 6 illustrates ASE power versus drive current. Referring to FIG. 6, the ASE power output from the SOA 11 is approximately at a constant level for a constant drive current, irrespective of the magnitude of the signal light power of the input light. The ASE power output from the SOA 11 changes in accordance with the drive current.

For instance, the ASE power output from the SOA 11 is approximately constant P1 for a drive current of I1 irrespective of the magnitude of the input light power. Likewise, the ASE power output from the SOA 11 is approximately constant P2 for a drive current of I2 irrespective of the magnitude of the input light power. Note that ASE powers P1 to Pn in FIG. 6 correspond to the ASE power over the whole wavelength range (the area defined by the waveform W2 in FIG. 5).

Figure 7:
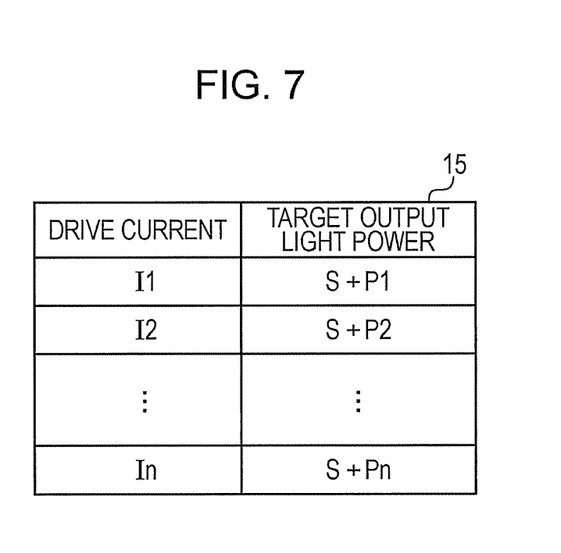
FIG. 7 illustrates an exemplary data configuration of a target output light power TB.

FIG. 7 illustrates an exemplary data configuration of the target output light power TB 15. Referring to FIG. 7, the target output light power TB 15 includes a drive current column and a target output light power column. The drive current column contains drive currents input to the SOA 11, and the target output light power column contains target output light power of the SOA 11.

The target output light power is the sum of signal light power S, which is a target for the output light output from the SOA 11, and the ASE powers P1 to Pn of the SOA 11. Since the output light of the SOA 11 is branched by the optical coupler 12 and input to the ALC circuit 14, the intensity ratio of the optical coupler 12 is considered in setting of the target output light power. For instance, when the intensity ratio of the optical coupler 12 is 9:1, as described above, the target output light power is set to 1/10 of the actual target output light power.

The signal light power S is the target power of the output signal output from the SOA 11, and is of a given level of power. Hence, the signal light power S at a given level is output from the SOA 11 by the ALC circuit 14 performing control such that there is no difference between the target output light power and the output light power output from the optical power detector 13.

The photodiode 21 of the optical power detector 13 described in FIG. 3 detects and outputs the output light power over the whole wavelength range of the output light which is output from the SOA 11. The comparator 32 compares the target output light power with the output light power over the whole wavelength range of the output light which is output from the optical power detector 13. Hence, the signal light power S and the ASE powers P1 to Pn correspond to values over the whole wavelength range.

The signal light power S is determined based on the input range of a receiver connected to the optical amplifier in a stage subsequent thereto. The ASE powers P1 to Pn corresponding to the respective drive currents may be obtained in advance from, for example, the ASE characteristics of the SOA 11, or measured by the optical amplifier itself, as will be described below.

Figure 8:
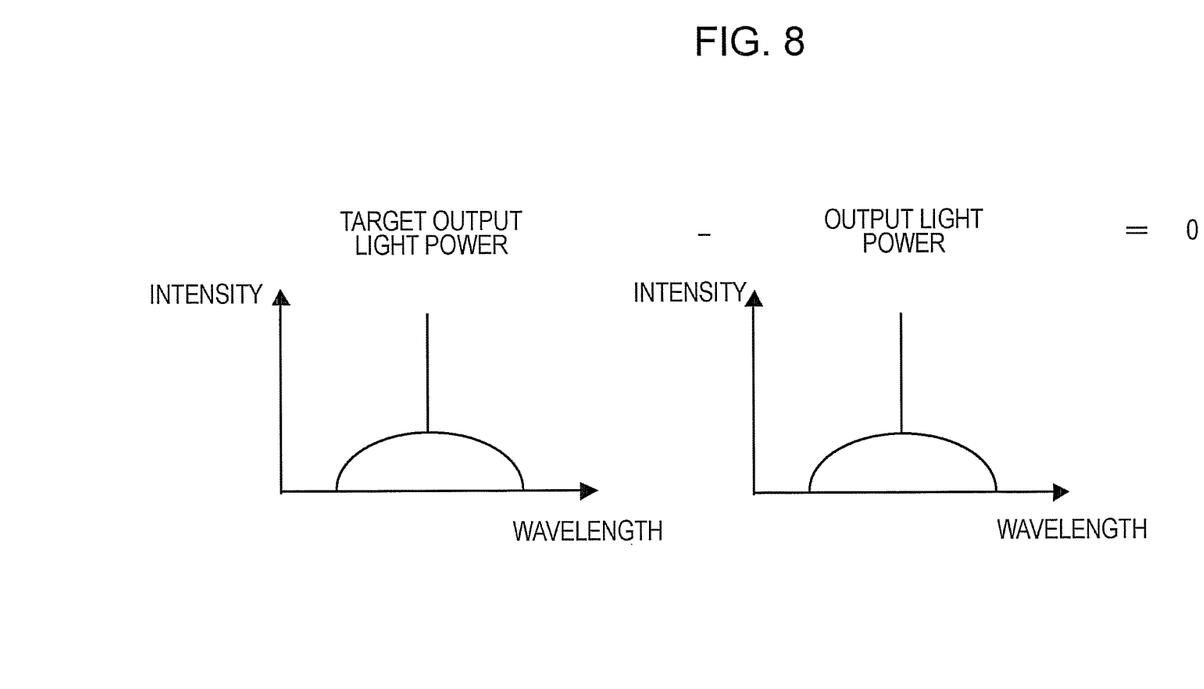
FIG. 8 illustrates an exemplary operation of the ALC circuit.

FIG. 8 illustrates an example operation of the ALC circuit 14. Referring to FIG. 8, the comparator 32 of the ALC circuit 14 compares the target output light power with the output light power by subtracting the output light power output from the optical power detector 13 from the target output light power output from the target output light power TB 15. The SOA drive circuit 31 controls the drive current such that there is no difference between the target output light power and the output light power. For instance, the SOA drive circuit 31, as illustrated in FIG. 8, controls the drive current such that the difference between the target output light power and the output light power becomes "0". In other words, the SOA drive circuit 31 outputs a drive current such that the output light power of the SOA 11 becomes the sum of the target signal light power S and the ASE power.

When there is no longer a difference between the target output light power and the output light power, the signal light power S is output from the SOA 11. In other words, the signal light power S at a given level is output from the SOA 11. Even when the input light power of the input light decreases, the output light power is controlled to be the same as the target output light power, whereby the SOA 11 outputs the signal light power S having a given level. Consequently, the signal light power S is controlled to have a given level, even when the input light power of the input light decreases and hence the ratio of ASE power to signal light power of the output light of the SOA 11 increases.

Since the amplification factor of the SOA 11 for obtaining the target signal light power S changes in accordance with the wavelength of the input signal light, the drive current output to the SOA 11 is changed. For instance, the longer the wavelength of the input light, the larger the required drive current. However, the SOA drive circuit 31 controls the SOA 11 such that the SOA 11 outputs output light power that is the sum of the target signal light power S and the ASE power corresponding to a drive current, so that the output signal light power is controlled to be at a given level irrespective of the wavelength of the signal light of the input light, even for different wavelengths of the signal light of the input light.

Figure 9:
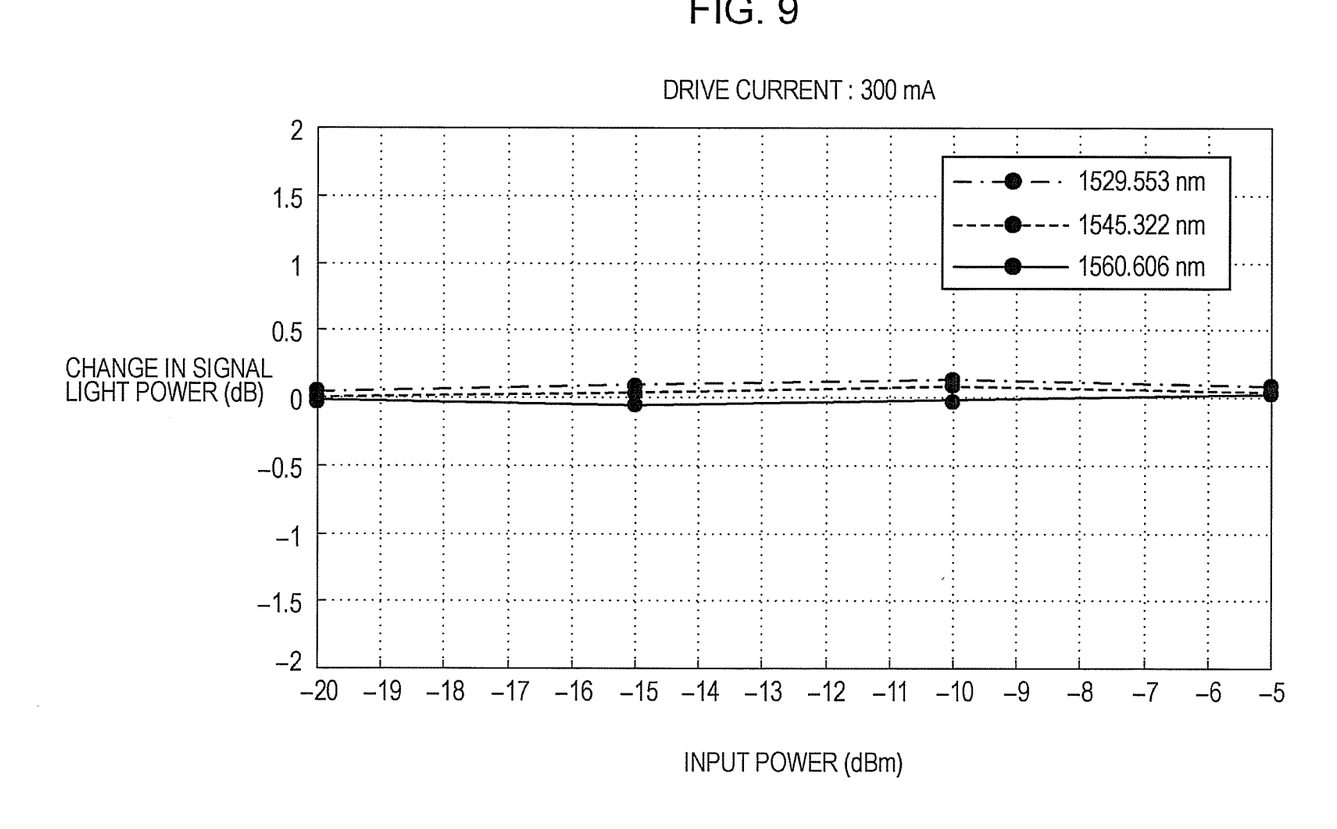
FIG. 9 illustrates change in signal light power versus the input light power of an SOA.

FIG. 9 illustrates change in the signal light power versus the input light power of the SOA 11. The horizontal axis represents the input power of the signal light input to the SOA 11, and the vertical axis represents change in the signal light power of the SOA 11. FIG. 9 illustrates change in the signal light power versus the input light power of the SOA 11 for three wavelengths.

Referring to FIG. 9, even when the input light power decreases, the change in the signal light power is approximately at a given constant level. The change in the signal light power is also approximately at a given constant level irrespective of the wavelength.

In other words, even when the input light power decreases, the signal light power is controlled to be at a given level by performing control such that the output light power is the same as the target output light power. The signal light power is also controlled to be at a given level irrespective of the wavelength of the signal light.

Not only for one-wavelength signal light, but also for, for example, signal light of wavelength division multiplexing (WDM) including a plurality of wavelengths, the optical amplifier may perform control such that the signal light power is at a given level irrespective of the magnitude of the signal light power or the wavelength of the input light.

When a WDM signal is used, the optical amplifier in FIG. 2 is different from that for one-wave case in the target values of the signal light power in the target output light power TB 15. For instance, when an n-wave WDM signal is used, the signal light power in the target output light power TB 15 is nS, where S is assumed to be the target signal light power of the signal light per wavelength. Hence, the content of the target output light power column illustrated in FIG. 7 is nS+P1, nS+P2, . . . , and nS+Pn.

Figure 10:
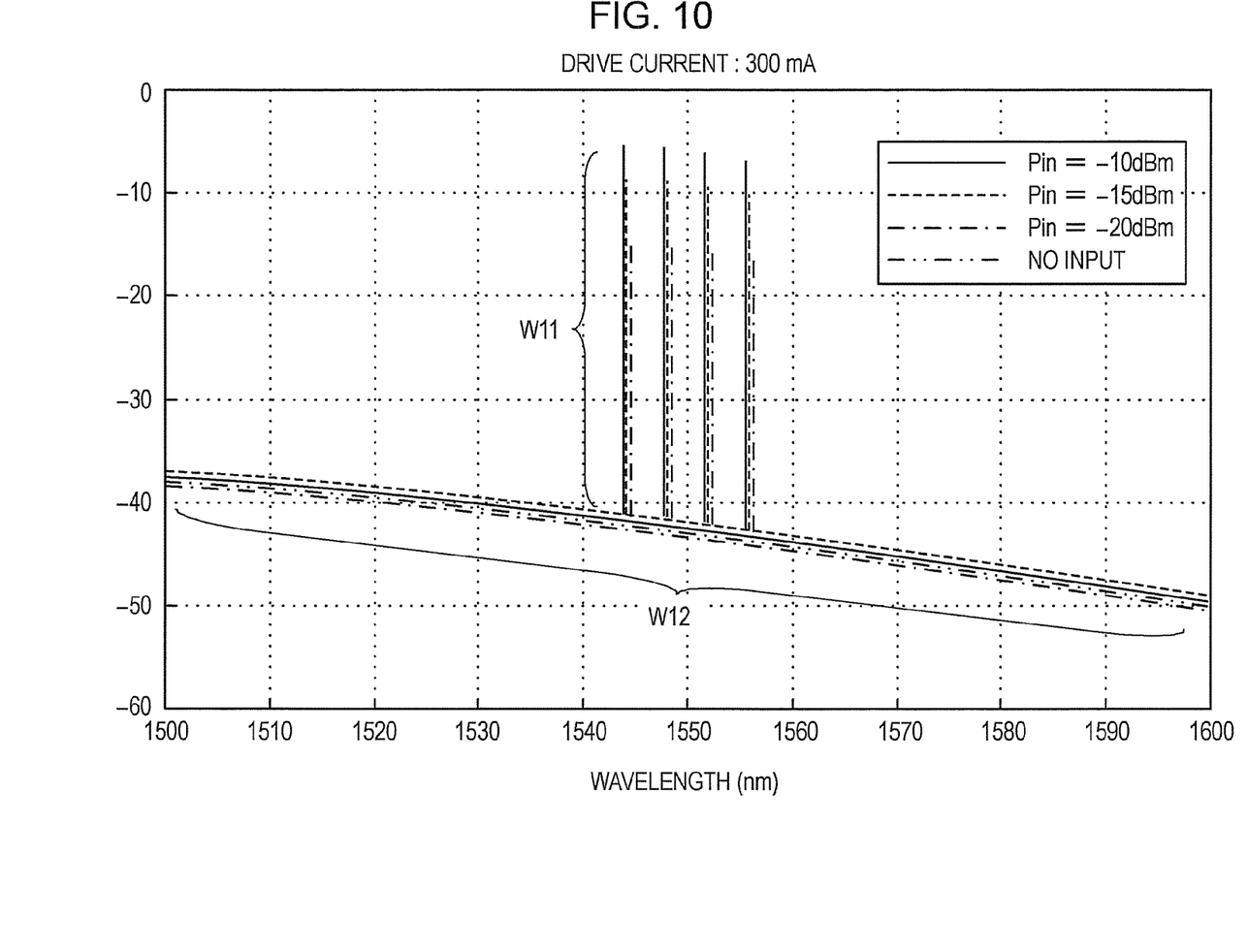
FIG. 10 illustrates SOA output light spectra for different levels of the input light power of a four-wave WDM signal.

FIG. 10 illustrates the SOA 11 output light spectra for different levels of the input light power of a four-wave WDM signal. The horizontal axis in FIG. 10 represents wavelength and the vertical axis represents power. The SOA 11 output light spectra illustrated in FIG. 10 correspond to the case where the drive current of the SOA 11 is 300 mA.

FIG. 10 illustrates the SOA 11 output light spectra for three levels of the signal light power of input light corresponding to a four-wave WDM signal. FIG. 10 also illustrates the SOA 11 output light spectrum when there is no input light. In FIG. 10, waveforms W11 represent the SOA 11 output light spectra corresponding to the four-wave WDM signal light, and waveforms W12 represent the SOA 11 output light spectra corresponding to ASE.

The range used for the optical amplification of the SOA 11 is a linear range portion which does not cause signal deterioration. Hence, when the drive current is at a constant level, the magnitude of ASE power included in the output light of the SOA 11 is approximately at a constant level irrespective of the magnitude of the four-wave WDM signal light power or the presence/non-presence of the input light.

For instance, when the drive current of the SOA 11 is at a constant level of 300 mA, as illustrated in FIG. 10, the ASE power of the output light of the SOA 11 is approximately at a constant level even when the signal light power of the input light varies. The ASE power of the output light of the SOA 11 is approximately at a constant level even when input light is not input to the SOA 11. Also for the drive currents of other magnitudes, the ASE power of the output light of the SOA 11 is of course approximately at a constant level irrespective of the magnitude of the signal light power in the input light, when the drive current is at a constant level.

Hence, also when the input light input to the SOA 11 is a WDM signal, the output light power is controlled to be at a given level even for small input light power. In addition, the output signal light power is controlled to be at a given level irrespective of the wavelength of the WDM signal (for example, also for a four-wave WDM signal with wavelengths different from those of the four-wave WDM signal illustrated in FIG. 10).

As described above, the optical amplifier controls the drive current output to the SOA 11 based on the output light power output from the optical power detector 13 and the target output light power stored in the target output light power TB 15. The target output light power is based on the sum of the signal light power and the ASE power, whereby the signal light power is controlled to be at a given level irrespective of the magnitude of the optical power of the input light and irrespective of the wavelength of the input light.

Although the target output light power TB 15 stores the sum of the target signal light power and the ASE power, the target output light power TB 15 may store only the ASE power. In this case, the comparator 32 compares the output light power output from the optical power detector 13 with the sum of the ASE power output from the target output light power TB 15 and the target signal light power.

A second embodiment will now be described in detail with reference to the drawings. Automatic generation of the target output light power TB 15 will be described in the second embodiment.

Figure 11:
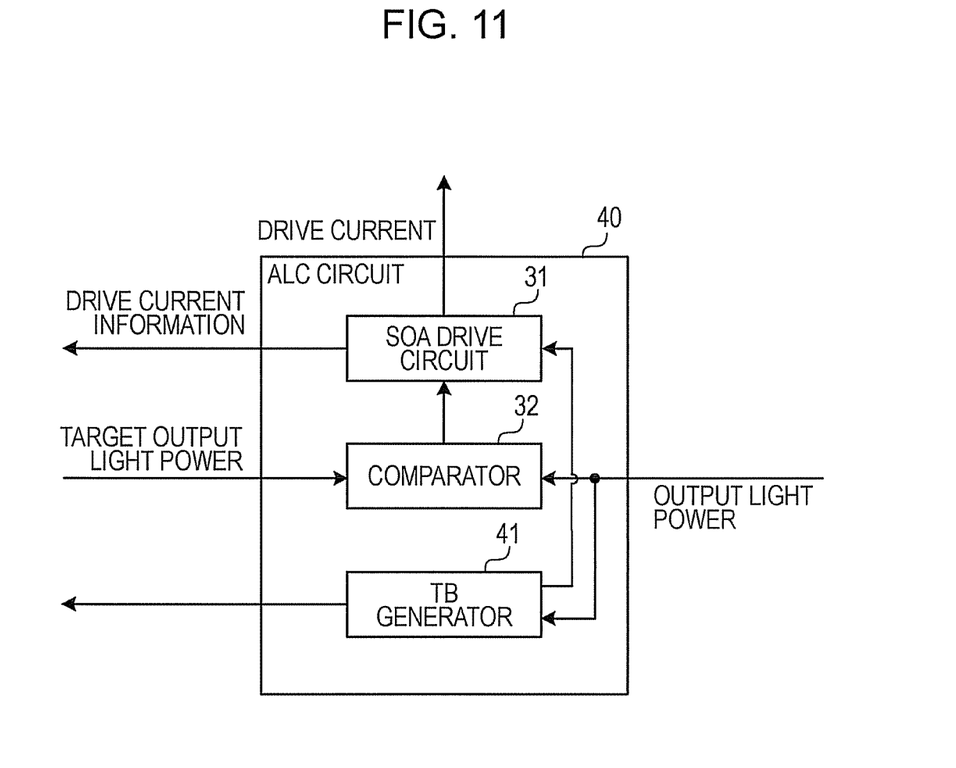
FIG. 11 illustrates the details of an ALC circuit of an optical amplifier according to a second embodiment.

FIG. 11 illustrates the details of an ALC circuit of an optical amplifier according to the second embodiment. The other portions of the optical amplifier are similar to the first embodiment.

Referring to FIG. 11, the ALC circuit 40 includes an SOA drive circuit 31, a comparator 32, and a TB generator 41. The SOA drive circuit 31 and the comparator 32 are similar to those described in FIG. 4 and the descriptions thereof are omitted.

The TB generator 41 generates the target output light power TB 15, for example, when the optical amplifier operates after switching the power on. The TB generator 41 periodically updates the target output light power TB 15 to deal with the long-term change in the ASE power, etc. of the SOA 11.

When the target output light power TB 15 is to be generated, it is required to stop input of the input light to the SOA 11. For instance, input of the input light to the optical amplifier may be manually stopped, or may be controlled by the TB generator 41, which controls a device for passing/intercepting the input light provided in a stage prior to the SOA 11.

The TB generator 41 obtains output light power output from the optical power detector 13 by changing the drive current output from the SOA drive circuit 31. Since input light is not input to the SOA 11, the output light power output from the optical power detector 13 is the ASE power of the SOA 11. The TB generator 41 adds the target signal light power to ASE power corresponding to each drive current, thereby generating the target output light power TB 15 illustrated in FIG. 7.

Figure 12:
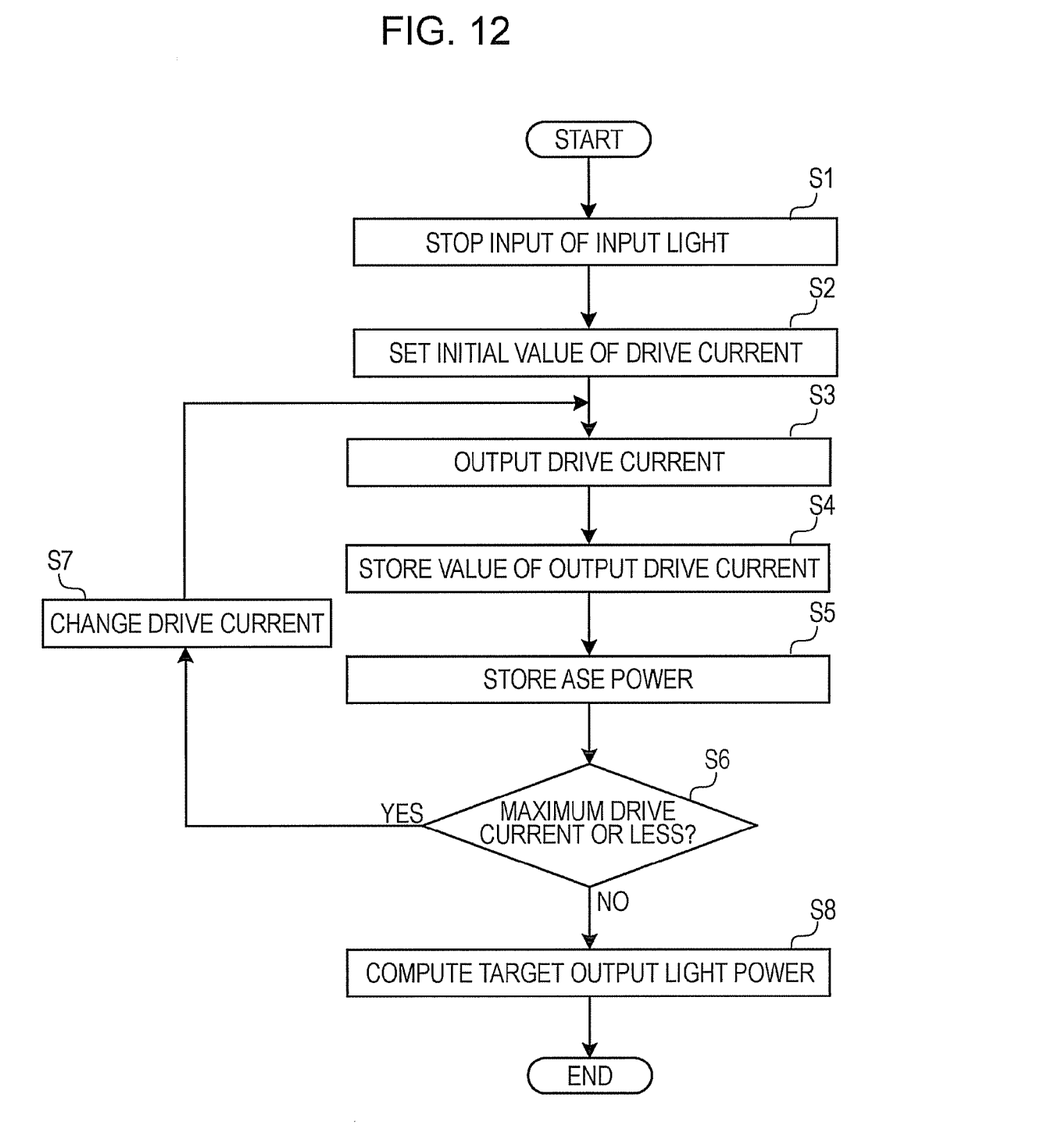
FIG. 12 illustrates an operation of a TB generator.

FIG. 12 illustrates a method of operation of the TB generator 41. The TB generator 41 generates the target output light power TB 15 based on the following operation, for example, when the optical amplifier operates after switching the power on. The TB generator 41 periodically updates the target output light power TB 15 to deal with the long-term change in the ASE power etc. of the SOA 11 based on the following operation. In operation S1, input of the input light to the SOA 11 is stopped.

In operation S2, the TB generator 41 sets the initial value of a drive current in the SOA drive circuit 31. The initial value is, for example, the minimum drive current.

In operation S3, the SOA drive circuit 31 outputs the drive current set by the TB generator 41 to the SOA 11.

In operation S4, the TB generator 41 temporarily stores in a memory the value of the drive current set in the SOA drive circuit 31.

In operation S5, the TB generator 41 temporarily stores the ASE power of the SOA 11 output from the optical power detector 13 in the memory.

In operation S6, the TB generator 41 determines whether or not the drive current set in the SOA drive circuit 31 is the maximum drive current or less. When it is determined that the drive current set in the SOA drive circuit 31 is the maximum drive current or less, the TB generator 41 proceeds to operation S7. When it is determined that the drive current set in the SOA drive circuit 31 is larger than the maximum drive current, the TB generator 41 proceeds to operation S8.

In operation S7, the TB generator 41 increases the drive current by a certain amount and sets it in the SOA drive circuit 31. Note that after operation S7, the control proceeds to operation S3. The SOA drive circuit 31 outputs the drive current set by the TB generator 41 to the SOA 11.

In operation S8, the TB generator 41 computes the target output light power by adding the target signal light power to the ASE power temporarily stored in the memory. The TB generator 41 stores, in the target output light power TB 15, the target output light power in association with the drive current stored in the memory.

Note that although the drive current is gradually increased from the minimum, as described above, the drive current may be gradually decreased from the maximum.

Since the optical amplifier generates the target output light power TB 15 at the time of switching the power on in this manner, the setting of the target output light power TB 15 at the time of manufacturing is easy. In addition, the target output light power based on the ASE power of the SOA 11 is set in the target output light power TB 15.

Furthermore, periodical update of the target output light power TB 15 allows the signal power to be controlled to be at a given level using the target output light power taking into consideration the long-term deterioration of the ASE power of the SOA 11.

According to the disclosed optical amplifier, control circuit, and method of controlling the optical amplifier, the output power of signal light is controlled to be at a given level irrespective of the magnitude of the optical power of input light and irrespective of the wavelength of the input light.

Further, according to an aspect of the embodiments, any combinations of the described features, functions and/or operations can be provided.

The many features and advantages of the embodiments are apparent from the detailed specification and, thus, it is intended by the appended claims to cover all such features and advantages of the embodiments that fall within the true spirit and scope thereof. Further, since numerous modifications and changes will readily occur to those skilled in the art, it is not desired to limit the inventive embodiments to the exact construction and operation illustrated and described, and accordingly all suitable modifications and equivalents may be resorted to, falling within the scope thereof.

What is claimed is:

1. An optical amplifier, comprising:
   a semiconductor optical amplifier that amplifies an input signal light and outputs an amplified signal light and that outputs a noise light power in accordance with a drive current;
   a single detector that detects an optical power branched from output light of the semiconductor optical amplifier; and
   an automatic level controller that controls supply of the drive current, based on only the output optical power detected by the single detector, such that an output light power of the semiconductor optical amplifier is a sum of a target signal light power and the noise light power.

2. The optical amplifier according to claim 1, wherein the optical amplifier includes a table that stores the drive current and, in association therewith, a target output light power based on power that is a sum of the noise light power corresponding to the drive current and the target signal light power.

3. The optical amplifier according to claim 2, wherein the control circuit obtains, from the table, the target output light power corresponding to the drive current currently being output, and compares the target output light power with the optical power, and outputs the drive current based on the comparison result.

4. The optical amplifier according to claim 2, wherein the optical amplifier includes a table generator that generates the table.

5. The optical amplifier according to claim 4, wherein the table generator generates the table by changing the drive current in a state in which the input light is not input to the semiconductor amplifier, and by measuring the noise light power corresponding to the change.

6. The optical amplifier according to claim 4, wherein the table generator generates the table when the optical amplifier operates after the power has been switched on, or generates the table periodically.

7. The optical amplifier according to claim 1, wherein the optical amplifier amplifies wavelength-division-multiplexing signal light.

8. The optical amplifier according to claim 1, wherein the optical amplifier includes a table storing the drive current and, in association therewith, a target output light power based on the noise light power corresponding to the drive current.

9. A control circuit, comprising:
an automatic level control circuit configured to control a semiconductor optical amplifier that amplifies input light and outputs amplified light and outputs a noise light power in accordance with a drive current,
wherein the automatic level control circuit outputs the drive current, based on only an optical power detected by a single detector detecting light branched from output light of the semiconductor optical amplifier detected by the single detector, such that an output light power of the semiconductor amplifier is a sum of a target signal light power and the noise light power.

10. A method of controlling an optical amplifier for amplifying light, comprising:
detecting, by a single detector, an optical power of light branched from output light of a semiconductor optical amplifier that generates a noise light power in accordance with a drive current; and
outputting the drive current, based on only the output optical power such that an output light power of the semiconductor optical amplifier is a sum of a target signal light power and the noise light power.

11. An optical amplifier, comprising:
a semiconductor optical amplifier that amplifies input light and outputs amplified light and that outputs a noise light power in accordance with a drive current; and
an automatic level control circuit that outputs, based on only an optical power detected by a single detector detecting light branched from output light of the semiconductor optical amplifier, the drive current having a new value such that output light power of the semiconductor amplifier is a sum of a target signal light power and the noise light power corresponding to the current drive current.

12. An optical amplifier, comprising:
a semiconductor optical amplifier that amplifies input signal light and outputs amplified signal light and that outputs a noise light power in accordance with a drive current;
a detector that detects an optical power branched from output light of the semiconductor optical amplifier; and
an automatic level controller that controls supply of the drive current, based on only the output optical power detected by the detector such that an output light power of the semiconductor optical amplifier is a sum of a target signal light power and the noise light power.

* * * * *